(12) United States Patent
Chung et al.

(10) Patent No.: US 7,239,524 B2
(45) Date of Patent: Jul. 3, 2007

(54) RESISTIVE ELEMENT APPARATUS AND METHOD

(75) Inventors: Chee-Yee Chung, Chandler, AZ (US); Robert L. Sankman, Phoenix, AZ (US); Alex Waizman, Zichron Yaakov (IL)

(73) Assignee: Intel Corporation, Santa Clara, CA (US)

( * ) Notice: Subject to any disclaimer, the term of this patent is extended or adjusted under 35 U.S.C. 154(b) by 864 days.

(21) Appl. No.: 09/977,124

(22) Filed: Oct. 12, 2001

(65) Prior Publication Data

US 2003/0072140 A1 Apr. 17, 2003

(51) Int. Cl.
H05K 7/02 (2006.01)
H05K 7/06 (2006.01)
H05K 7/08 (2006.01)
H05K 7/10 (2006.01)

(52) U.S. Cl. ............... 361/760; 361/763; 361/765; 361/779

(58) Field of Classification Search ........ 174/259–261; 361/763–766, 783, 784, 792–795; 333/12; 338/309
See application file for complete search history.

(56) References Cited

U.S. PATENT DOCUMENTS

| | | | | |
|---|---|---|---|---|
| 4,661,838 A | * | 4/1987 | Wildi et al. | 257/336 |
| 4,794,353 A | * | 12/1988 | Broyde | 333/167 |
| 5,061,913 A | * | 10/1991 | Okochi et al. | 333/181 |
| 5,593,722 A | * | 1/1997 | Otani et al. | 427/101 |
| 5,801,065 A | * | 9/1998 | Rizvi et al. | 438/393 |
| 5,834,832 A | * | 11/1998 | Kweon et al. | 257/676 |
| 6,114,930 A | * | 9/2000 | Gobbi et al. | 333/214 |
| 6,201,286 B1 | * | 3/2001 | Nagasaka | 257/528 |
| 6,225,570 B1 | * | 5/2001 | Ishiyama et al. | 174/260 |
| 6,424,234 B1 | * | 7/2002 | Stevenson | 333/182 |
| 6,525,622 B1 | * | 2/2003 | Novak et al. | 333/32 |
| 6,606,012 B2 | * | 8/2003 | Novak | 333/17.3 |
| 6,870,436 B2 | * | 3/2005 | Grebenkemper | 333/12 |

\* cited by examiner

*Primary Examiner*—Tuan Dinh
(74) *Attorney, Agent, or Firm*—Schwegman, Lundberg, Woessner & Kluth, P.A.

(57) ABSTRACT

A resistive element, a circuit board, and a circuit package, as well as a method of adding a resistive element to a circuit board are described. The resistive element includes a first contact point connected to a capacitor terminal, a second contact point connected to a circuit board plane, and resistive material connected to the first and second contact points. The invention may also include a circuit board with one or more resistive elements, as well as a circuit package, such as an integrated circuit or a discrete bypass capacitor, including one or more resistive elements, applied to an outside surface. The value of resistance for the resistive element can be selected by design to have a predetermined relationship with the equivalent resistance of an associated circuit board and connecting circuitry.

18 Claims, 7 Drawing Sheets

RESISTIVE ELEMENT APPARATUS AND METHOD

RELATED PATENTS

This application is related to co-pending application Ser. No. 09/946,963; filed on Sep. 06, 2001, titled "Power Delivery System and Method for Setting Power Delivery System Parameters", which is commonly assigned to the assignee of the present invention.

FIELD OF THE INVENTION

The present invention relates generally to the addition of resistive elements to physical circuitry. More particularly, the present invention relates to resistive elements as individual components, and as elements of circuit boards and circuit packaging, including integrated circuits, resistors, and capacitors.

BACKGROUND INFORMATION

As integrated circuit (IC) technology continues to advance, and operational clocking speeds increase, chips require more power more quickly. The traditional concept behind using capacitors to decouple ICs is to give each IC a localized reservoir of high-frequency energy. In essence, local capacitors help to "decouple" associated ICs from the main power supply, decreasing the magnitude of high frequency ripple or sag that appears on the main power bus. The bulk decoupling capacitor on a circuit board, in turn, replenishes each of the local capacitors.

Unfortunately, a capacitor is not an ideal circuit element. In fact, the capacitor is typically modeled as a series circuit, as shown in prior art FIG. 1. Here the equivalent circuit 101 for a motherboard power supply decoupling capacitor 103, a local bypass capacitor 104, and the connecting circuitry 102 between them can be seen. The power supply PS provides power to the equivalent circuit 101, which in turn passes the power on to the integrated circuit package IC. The equivalent circuit 101 may include, as modeled in this example, the mother board power supply decoupling capacitor 103 series elements $C_{MB}$, $ESR_{MB}$, and $L_{MB}$ connected in parallel with the sum of the connecting circuitry 102 series elements $L_{PLNS+SKT}$ and $R_{PLNS+SKT}$ and the local bypass capacitor 104 series elements $C_{CPKG}$, $ESR_{CPKG}$, and $L_{CPKG}$).

Because a real-world capacitor is not ideal, including both reactive and resistive operational components, its response to transients varies as a function of frequency. Thus, at low frequencies, the capacitive reactance due to $C_{CPKG}$ is quite high, dominating the equivalent impedance. As the frequency increases, the capacitive reactance due to $C_{CPKG}$ decreases at a rate of about 20 dB/decade, while the inductive reactance due to $L_{CPKG}$ increases by the same amount. At the self-resonant frequency (SRF), or $1/\sqrt{L_{CPKG}C_{CPKG}}$, where the capacitive and inductive reactances are equal but opposite in phase, the impedance of the capacitor 104 is simply equivalent to the equivalent series resistance for the capacitor, or $ESR_{CPKG}$. Above the SRF, the equivalent impedance increases, as the inductive reactance due to $L_{CPKG}$ dominates.

In addition, when a capacitor is placed on a circuit board, the inductance of the traces and other connecting circuitry (e.g., $L_{PLNS+SKT}$) between the capacitor and the associated chip further affects chip performance at high clock speeds. The bypass element 104, and the connecting circuitry (traces) 102 that lead to it, form a current loop which operates as an antenna for transmitting radio frequency interference generated by fast transients. Thus, bypass capacitors can do their job most efficiently only if mounted in close proximity to the associated chip pins that draw transient currents.

In addition to low series inductance $L_{CPKG}$ in a capacitor, it's usually desirable to have a low effective series resistance ($ESR_{CPKG}$), which goes hand-in-hand with a low dissipation factor. However, sometimes a very low $ESR_{CPKG}$ can provoke unexpected problems in the form of resonance, especially when the value of $ESR_{MB}$ is not matched to the sum of $ESR_{CPKG}$ and $R_{PLNS+SKT}$ and when $(L_{PLNS+SKT}+L_{MB})/(R_{PLNS+SKT}+ESR_{MB}) >> C_{CPKG} * ESR_{CPKG}$. When repetitive pulses excite the resonator formed by a low equivalent series resistance capacitor and the motherboard, high-amplitude ringing can result, producing an exceedingly noisy supply bus. The typical solution is to place electrolytic capacitors across the bus to damp the ringing, which is costly and uses a large amount of circuit board real estate. A better solution would be to somehow increase the series resistance of the bypass capacitor $ESR_{CPKG}$, without adding additional capacitance or inductance.

Thus, there is a need in the art to provide additional series resistance for bypass capacitors, connected in parallel with the equivalent series resistance of the associated circuit board power supply decoupling capacitor. Adding this type of series resistance, possibly in the form of a separate resistive element, should be accomplished at low cost, without substantially increasing the inductive reactance of the equivalent circuit. The amount of series resistance added should also be selectable, in accordance with what is necessary to dampen the resonant frequency response of the equivalent circuit between the associated power supply and integrated circuit package. There is also a need in the art for a method to add series resistance to the equivalent circuit, as described above.

DESCRIPTION OF THE PREFERRED EMBODIMENTS

Figure 1:
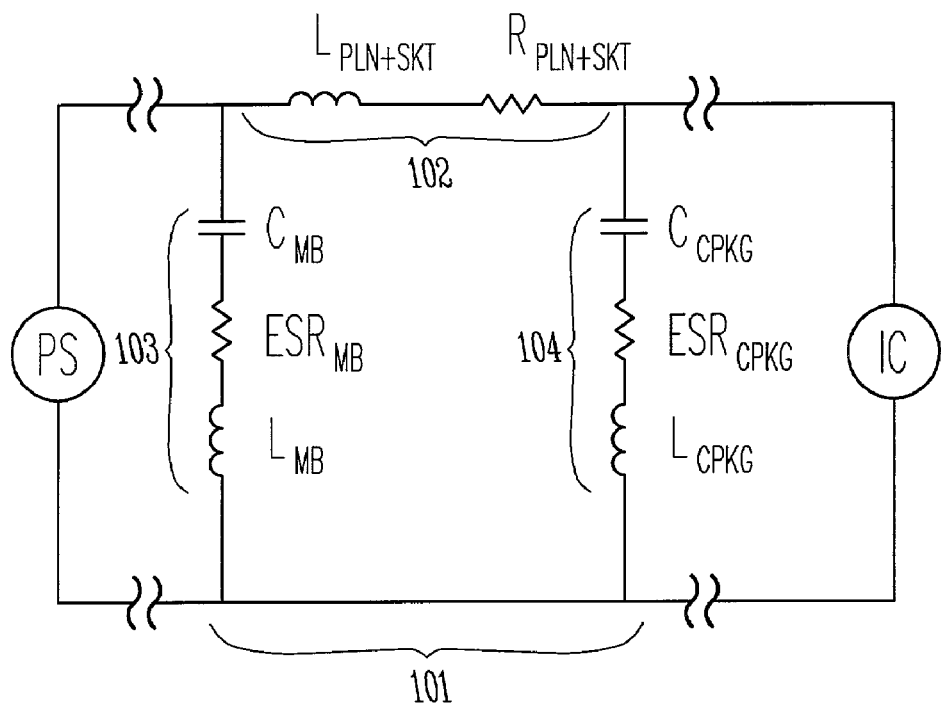
FIG. 1, previously described, is a prior art schematic diagram of an equivalent circuit for a circuit board connected to a bypass capacitor.

In the following detailed description of the invention, reference is made to the accompanying drawings which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in the art to practice the invention. Other embodiments may be utilized and derived therefrom, such that structural, logical, and electrical circuit substitutions and changes may be made without departing from the scope of the invention. The following detailed description, therefore, is not to be taken in a limiting sense, and the scope of the invention is defined only by the appended claims, along with the full range of equivalents to which such claims are entitled.

Figure 2:
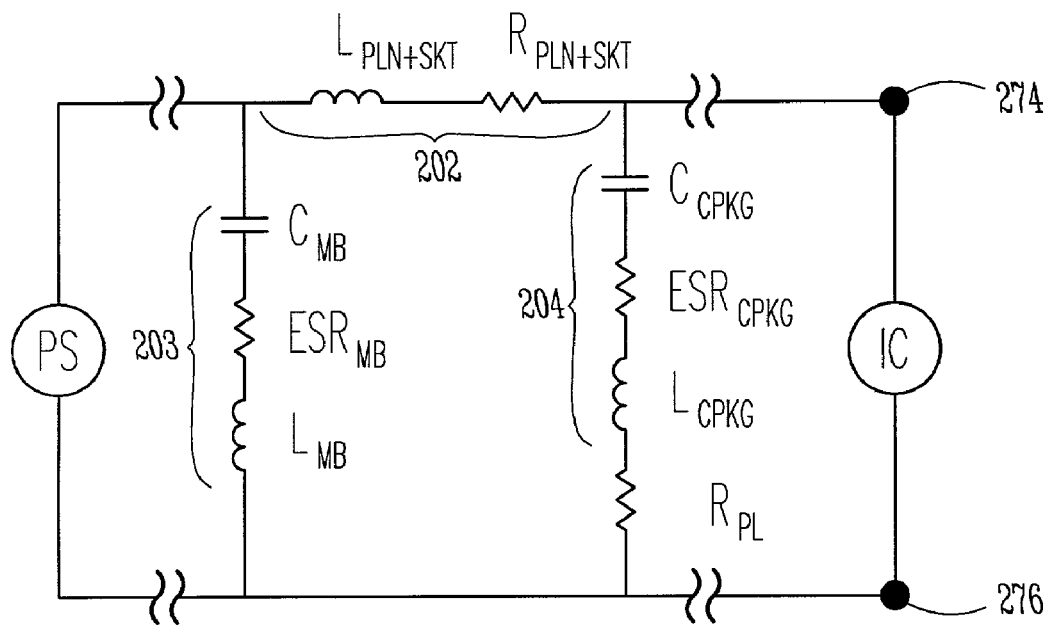
FIG. 2 is a schematic diagram of an equivalent circuit for a circuit board connected to a capacitor, including an added resistive element, according to the present invention.

FIG. 2 is a schematic diagram of an equivalent circuit for a circuit board connected to a capacitor, including an added resistive element $R_{PL}$, according to the present invention. It should be noted that the resistive element $R_{PL}$ has been added in series with the bypass capacitor 204 and the connecting circuitry 202. Therefore, the series combination of the resistive element $R_{PL}$, the package bypass capacitor 204 (which includes series elements of $C_{CPKG}$, $ESR_{CPKG}$, and $L_{CPKG}$) and the connecting circuitry 202 (which has a series elements of $L_{PLNS+SKT}$ and $R_{PLNS+SKT}$) is now connected in parallel with the associated motherboard capacitor 203 (which includes the series elements of $C_{MB}$, $ESR_{MB}$, and $L_{MB}$). Thus, in this case, the power supply PS transfers energy to the equivalent circuit which is the parallel combination of the motherboard capacitor 203 impedance and the series impedance of the connecting circuitry 202, the capacitor 204, and the resistive element $R_{PL}$. The energy is in turn transferred to the pair of power terminals 274, 276 of the integrated circuit package IC. The amount of resistance added due to $R_{PL}$ can be adjusted to dampen ringing or other effects of resonance arising out of the prior art circuitry shown in FIG. 1, without necessarily increasing the loop area of charge flow path, thus not introducing additional inductance.

Thus, in one embodiment, the invention may be characterized as a resistive element $R_{PL}$ and a bypass capacitor 204 in combination with a circuit board capacitor 203 proximate to an integrated circuit (IC). The magnitude or value of resistance for the resistive element $R_{PL}$, which is connected in series with the bypass capacitor 204 across the power terminals 274, 276 of the IC, is selected so that when added to the effective series resistance $ESR_{CPKG}$ of the bypass capacitor 204 and the equivalent series resistance of the connecting circuitry (such as one or more circuit board planes or traces, or a circuit board power plane) $R_{PLNS+SKT}$, the summed series resistance (i.e., $R_{PL}+ESR_{CPKG}+R_{PLNS+SKT}$) has a predetermined relationship to the effective series resistance $ESR_{MB}$ of the associated circuit board capacitor 203. Thus, the summed series resistance $R_{PL}+ESR_{CPKG}+R_{PLNS+SKT}$ can be selected to be approximately equal to the effective series resistance of $ESR_{MB}$.

Figure 3:
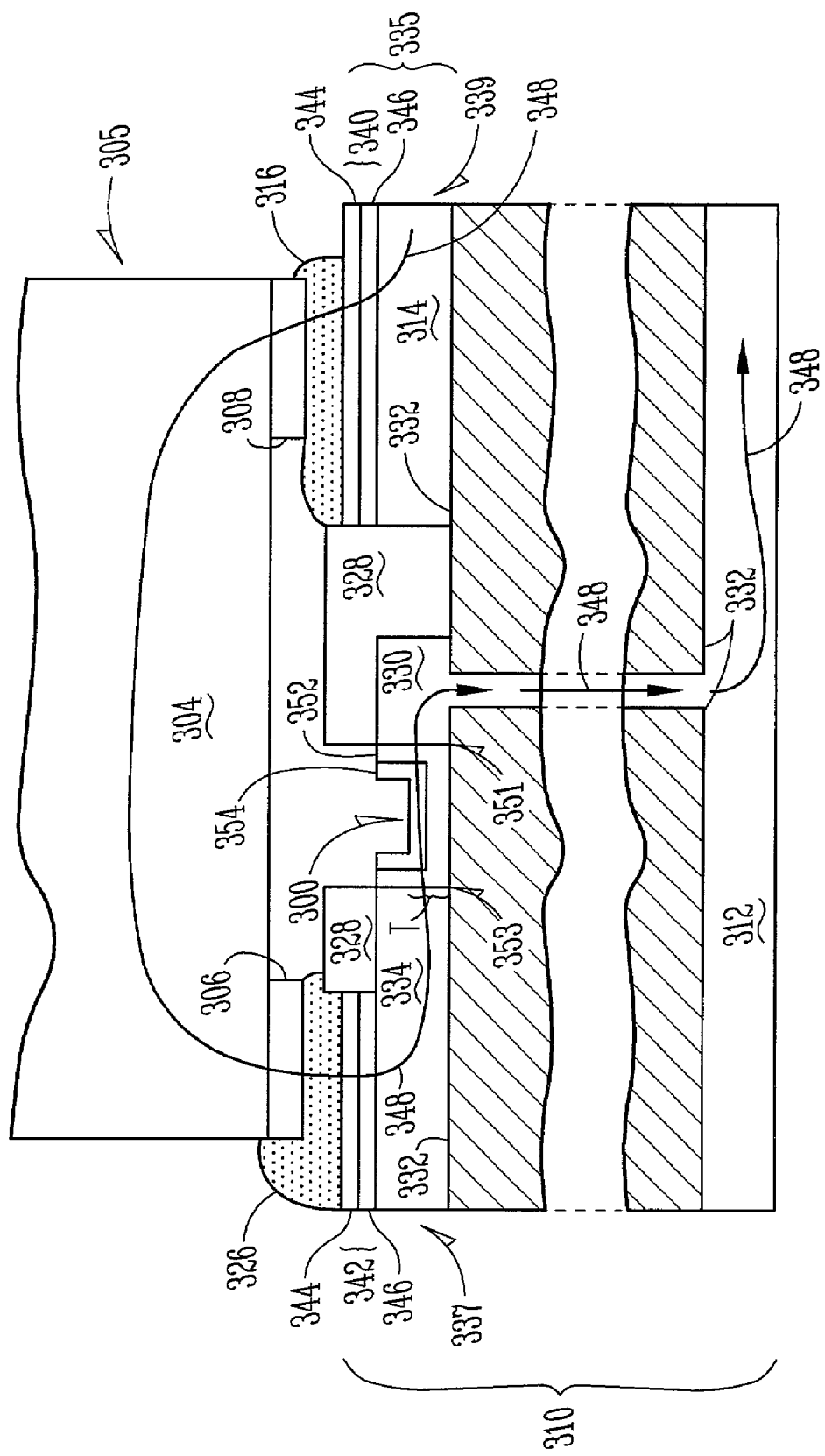
FIG. 3 is a side, cut-away view of a circuit board connected to a capacitor and a resistive element according to the present invention.

FIG. 3 is a side, cut-away view of a circuit board 310 connected to a capacitor 305 and a resistive element 300 according to the present invention. A conventional surface mount capacitor 305 includes a body 304 and terminals 306 and 308. The circuit board 310 includes, for example, a first layer 335, a dielectric layer 332, and a second layer 312, such as a power plane layer. The first layer 335 typically includes several conductors, such as a first conductor 337 (which may be a combination of copper 334 and plating 342, such as a coating of gold 344 over nickel 346) and a second conductor 339 (which may be a combination of copper 314 and plating 340, such as a coating of gold 344 over nickel 346).

The resistive element 300, which may be a combination of metals, such as a coating of gold 354 over nickel 352, is disposed between the first conductor 337 and the via 330. The first conductor 337 may be used to connect the first contact point 353 of the resistive element 300 to the terminal 306 of the capacitor 305. Similarly, the via 330 may be used to connect the second contact point 351 of the resistive element 300 to the second layer 312. As shown in this example, the terminals 306, 308 may be connected to the conductors 337, 339 using solder 326, 316, respectively. Conventional solder resist 328 is also shown, and may be used to prevent the solder 326, 316 from making a direct connection between the terminal 306 and the via 330, for example. Using connection scheme shown, the current 348 that travels from the capacitor terminal 306 to the second layer 312 is forced through the resistive element 300, which has the desired effect of introducing a resistance in series with the impedance presented by the capacitor 305 with respect to the associated power supply and integrated circuit, as shown in FIG. 2. Forcing the current 348 to double back on itself also serves to reduce the effective inductance of the capacitor 305. The mutual inductance current cancellation effect is maximized by ensuring that the body of the capacitor 305 is attached as closely to the surface of the circuit board 310 as is practical.

The series resistance provided by the resistive element 300 can thus be added without introducing relatively large amounts of effective inductance, such as would be inherent in the circuitry used to connect a standard surface mount resistor in series with the capacitor 305. Attempting to employ conventional surface mount resistors in this application, such as those provided in the commonly available 0612 and 0805 form factors, would indeed increase the series resistance, but will typically also lead to an intolerable increase in the effective inductance $L_{CPKG}$ (e.g., 3 or 4 times). Another problem with such an implementation is that 0612 and 0805 resistors are often unavailable in the 10–100 milliohm range.

Figure 4:
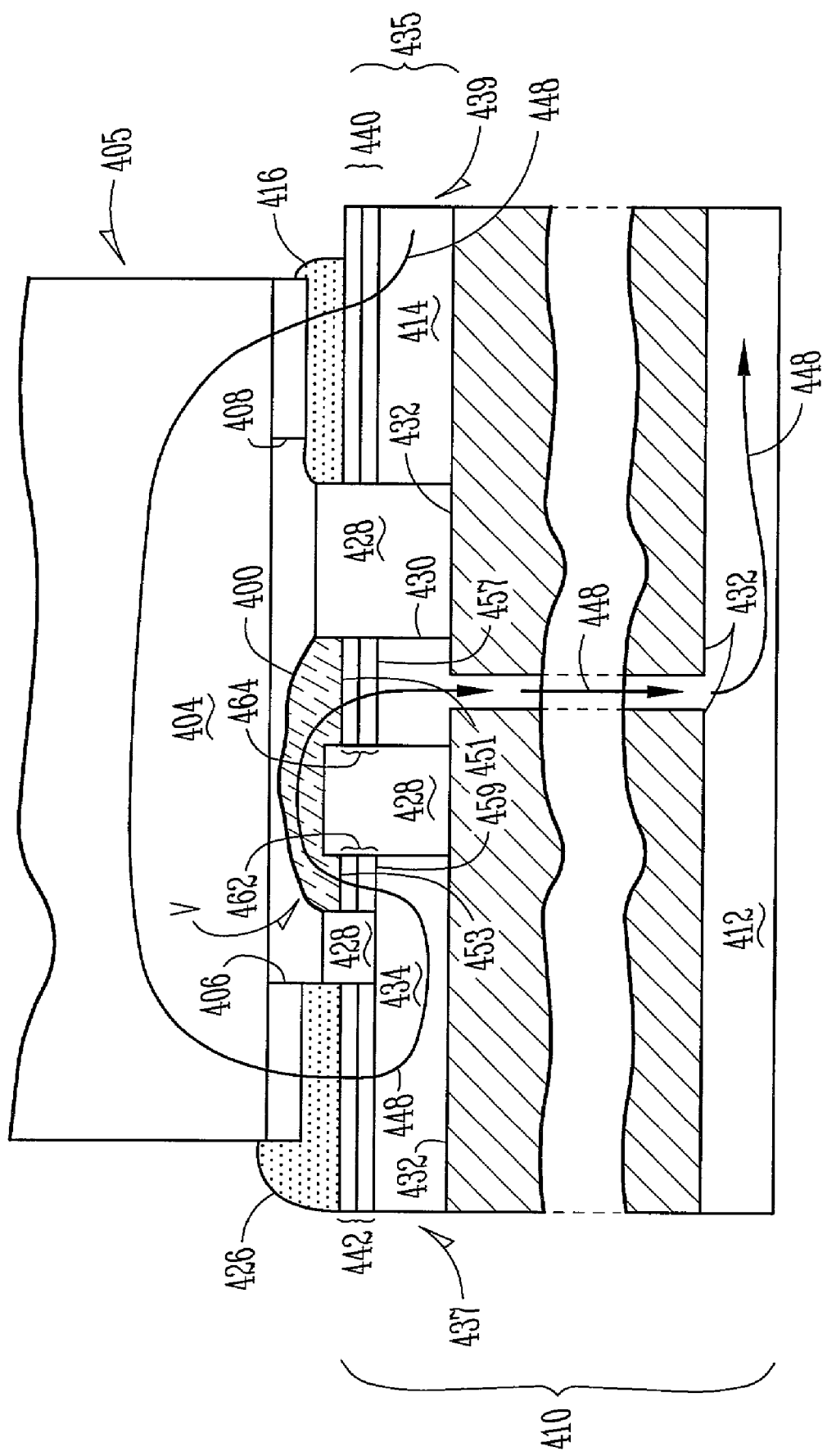
FIG. 4 is side, cut-away view of an alternative embodiment of a circuit board connected to a capacitor and a resistive element according to the present invention.

The resistive element 300 may comprise one or more resistive materials, each of which may in turn include one or more resistive components, such as the gold over nickel combination shown in FIG. 3. However, as can be seen in FIG. 4, which is a side, cut-away view of an alternative embodiment of a circuit board connected to a capacitor and a resistive element according to the present invention, the resistive element 400 can also be a conductive epoxy. Thus, the resistive material of the resistive element 400 may include one or more metals, a conductive epoxy, a ceramic, and/or a resistive film, or a combination of these, including a conductive metal oxide, a glass, a solvent, a polymer, nickel, chromium, tantalum, silicon monoxide, cobalt, alumina, sapphire, quartz, berillium, palladium, carbon, platinum, ruthenium, rhodium, and gold, further including various thin and thick film resistor materials, such as tantalum oxynitride, tantalum nitride, nichrome, silver palladium, platinum, ruthenium, rhodium, gold, and tantalum-modified tin oxide.

As shown in FIG. 4, a conventional surface mount capacitor 405 may include a body 404 and terminals 406, 408. The circuit board 410 may include, for example, a first layer 435, a dielectric layer 432, and a second layer 412, such as a power plane layer. The first layer 435 typically includes several conductors, such as a first conductor 437 (which may be a combination of copper 434 and plating 442) and a second conductor 439 (which may be a combination of copper 414 and plating 440).

The resistive element 400, which may include a conductive epoxy, or any of several other resistive materials, as described above, is disposed between the first conductor 437 and the via 430. The first conductor 437 may be used to connect the first contact point 453 of the resistive element 400 to the terminal 406 of the capacitor 405. Similarly, the via 430 may be used to connect the second contact point 451 of the resistive element 400 to the second layer 412. As shown in this example, the terminals 406, 408 may be connected to the conductor 437, 439 using solder 426, 416, respectively. Conventional solder resist 428 is also shown, and may be used to prevent the solder 426, 416 from making a direct connection between the first trace 437 and the via 430, for example. Using this type of connection scheme, the current 448 that travels from the capacitor terminal 406 to the second layer 412 is forced through the resistive element 400, which has the desired effect of introducing a resistance in series with the impedance presented by the capacitor 405 with respect to the associated power supply and integrated circuit, as shown in FIG. 2. As mentioned above, care must be taken so that the thickness of the resistive element 400 does not raise the body of the capacitor 405 away from the surface of the circuit board 410 to which it is attached. This is required to control and minimize the effective $L_{CPKG}$ resulting from the addition of $R_{PL}$. Relatively thick resistive elements 400 may raise the body of the capacitor 405, which increases the loop area of the current flow, which in turn increases $L_{CPKG}$. If design constraints dictate otherwise, alternative embodiments, discussed below, provide for locating the resistive element 400 outside of the capacitor 405 body, rather than in its shadow.

In this particular case, the resistive element 400 may be considered to comprise the conductive epoxy alone, or may include the combination of the conductive epoxy and the metallic contacts 462, 464, which may also serve as the location of alternate contact points 457, 459.

Figure 5:
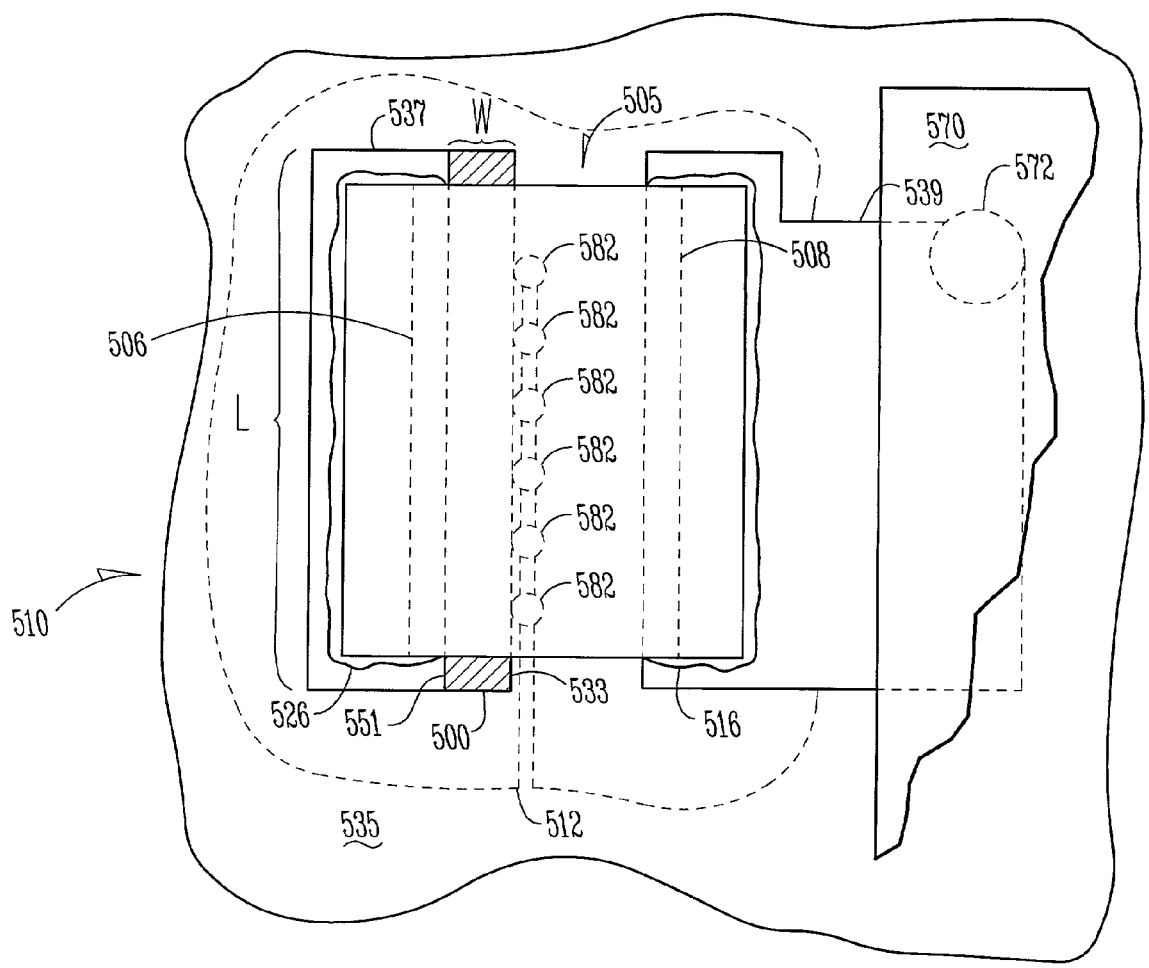
FIG. 5 is a top, plan view of a circuit board connected to a capacitor and a resistive element according to the present invention.

FIG. 5 is a top, plan view of a circuit board 510 connected to a capacitor 505 and a resistive element 500 according to the present invention. In this case, the terminal 506 is connected to the trace or pad 537 formed on the layer 535 of the circuit board 510 and the contact point 551 of the resistive element 500. As noted above, the first contact point 551 may be connected to the terminal 506 of the capacitor 505 using solder 526.

The resistive element 500, in turn, is connected by way of the contact point 553 to the vias 582, which in turn are connected to the power plane layer 512. Use of multiple vias 582 is preferred, as the practice reduces the inductance which may be added along the length L of the resistive element 500. The terminal 508 of the capacitor 505 is connected (typically using solder 516) to a surface trace or a plane 539, which is in turn connected to the circuit package 570 by way of the terminal 572. The use of multiple terminals 572 is also preferred, if possible, as the practice also serves to reduce circuit inductance.

Figure 6:
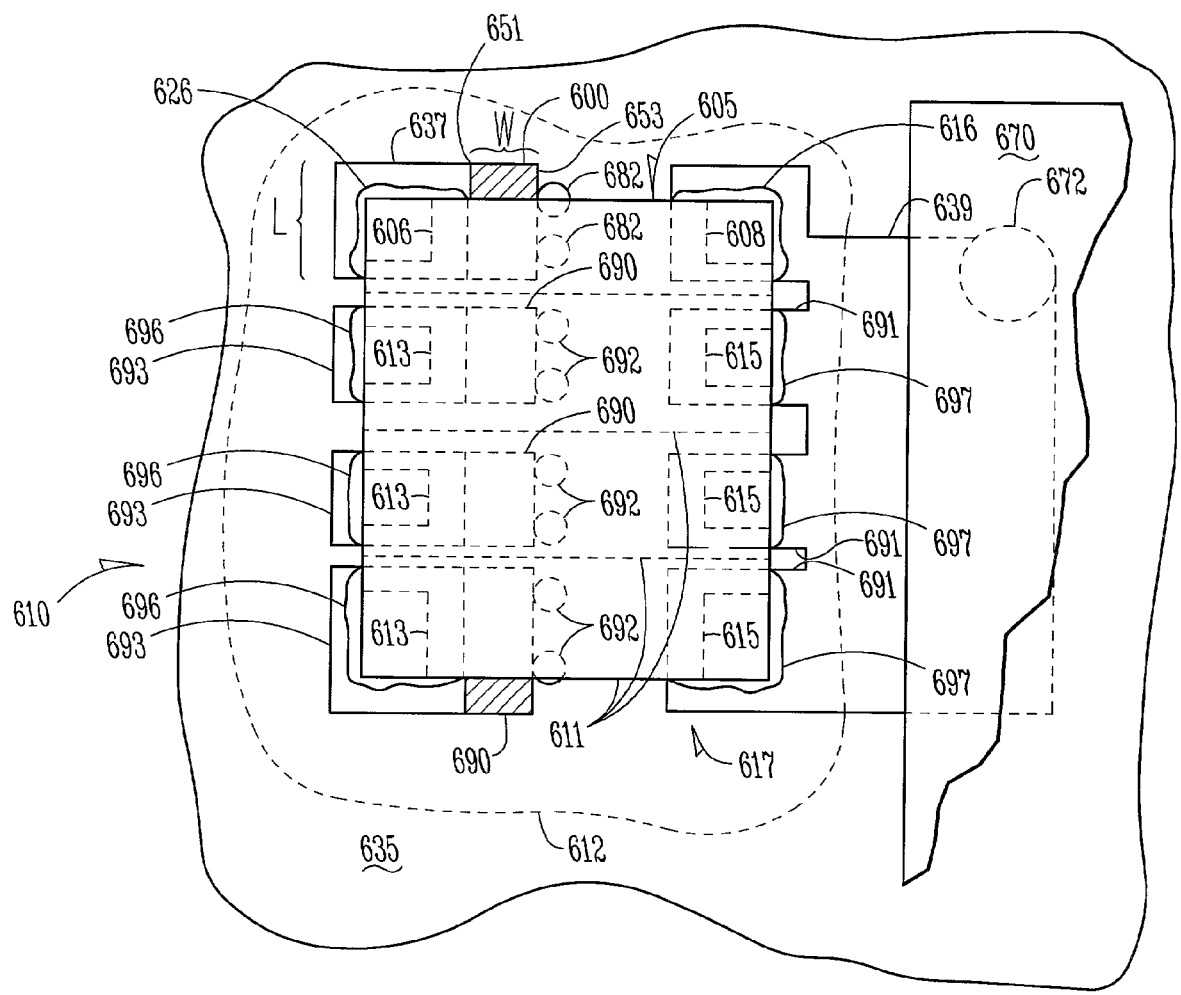
FIG. 6 is a top, plan view of an alternative embodiment of a circuit board connected to a plurality of capacitors and a corresponding plurality of resistive elements according to the present invention.

As noted above, the resistive element 500 may comprise any of several resistive materials, singly or in combination. The amount of resistance provided by the resistive element is selectable by design. For example, as can be seen in FIG. 4, the volumetric displacement V of the resistive element 400 can be measured as it is dispensed onto the circuit board layer 435. In fact, it may even be possible to probe the contact points 451, 453 of the resistive element 400 during the dispensing operation to obtain a more precise amount of resistance between the terminal 406 and the via 430. Alternatively, as can be seen in FIGS. 3, 5, and 6, the length L, width W, and thickness T of the resistive element 300, 500, 600 can be selected to provide a predetermined resistance between the contact points. For example, using a bimetallic gold over nickel configuration for the resistive element 500, with a nickel thickness of about 0.4 microns, and a gold thickness of about 0.08 microns (total thickness T=0.48 microns), with each layer having a length of about 400 microns and a width of about 3050 microns, the resistance of the element 500 will be about 14 milliohms. The total thickness of the bimetallic resistive element in this configuration will generally range from about 0.05 microns to about 2.5 microns, depending on the length L and width W, which may vary from about 10 to 1000 microns (for W) and from about 10 to 5000 microns (for L).

Many different embodiments of the invention may be devised. For example, FIG. 6 is a top, plan view of an alternative embodiment of a circuit board 610 connected to a plurality of capacitors 605 and a corresponding plurality of resistive elements 600, 690 according to the present invention. In this case, the terminal 606 is connected to the pad or trace 637 formed on the layer 635 of the circuit board 610 and the contact point 651 of the resistive element 600. As noted above, the first contact point 651 may be connected to the terminal 606 of the capacitor 605 using solder 626.

The resistive element 600, in turn, is connected by way of the contact point 653, to the vias 682, which in turn are connected to the power plane layer 612. The resistive element 600 may comprise any of several resistive materials, singly or in combination, and the use of multiple vias 682 is encouraged, as noted above. The terminal 608 of the capacitor 605 is connected (typically using solder 616) to the surface trace or plane 639, which is in turn connected to the circuit package 670 by way of the terminal 672. The use of multiple terminals 672 is also preferred, if possible, as the practice also serves to reduce circuit inductance.

Figure 7:
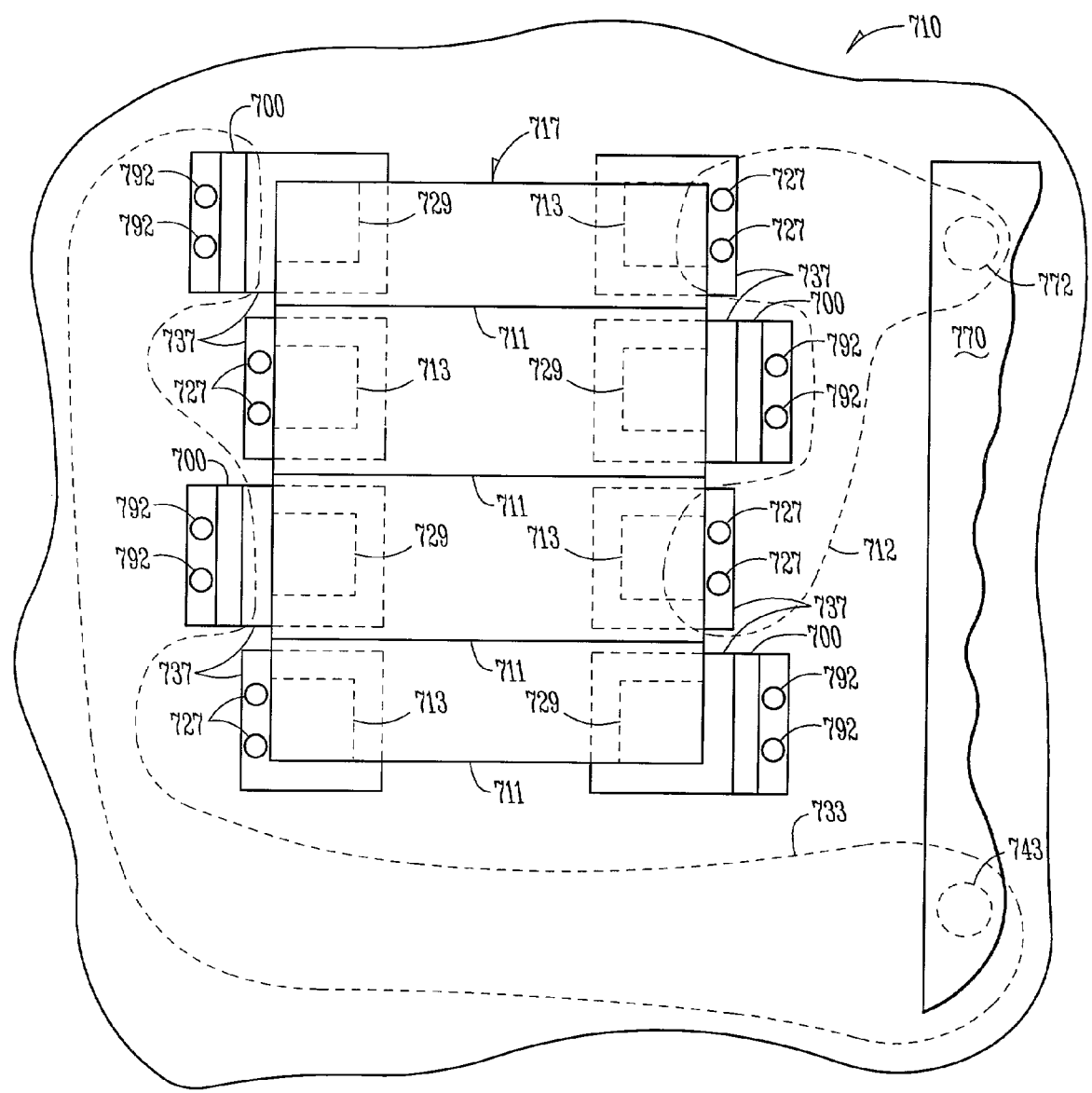
FIG. 7 is a top, plan view of an alternative embodiment of a circuit board connected to a plurality of capacitors and a corresponding plurality of resistive elements according to the present invention.

Other capacitors 611 may also be connected to the circuit board 610 using terminals 613, 615, and corresponding resistive elements 690, vias 692, pads or traces 693, 691, and solder 696, 697. The capacitors 605, 611 may be discrete entities, or formed as a single integrated device package 617. It should be noted that the connections to the capacitors 605, 611 shown in FIG. 6 have been simplified for illustrative purposes. Using commonly available packages of capacitors 617, it is likely that connections to the circuit package 670 will make use of alternating patterns of vias 682, 692 and resistive elements 600, 690. Such a configuration is shown in FIG. 7.

In this case, a capacitor package 717 and an integrated circuit package 770 are attached to a circuit board 710. The capacitor package 717 includes a plurality of individual bypass capacitors 711, each having a pair of terminals 713. On one end of each capacitor 711, a terminal 713 may be used to connect the capacitor 711 to a pad 737 on the circuit board 710, which is in turn connected using vias 727 to a power terminal 772 of the integrated circuit package 770, by way of a power plane 712. Use of multiple terminals 772 is preferred, as the practice reduces circuit inductance. On the other end of each capacitor 711, a terminal 729 may be used to connect to a resistive element 700. The resistive element may then be connected to a ground terminal 743 of the integrated circuit package 770 by way of vias 792 and a ground plane 733. Use of multiple terminals 792 is also preferred, as the practice serves to reduce circuit inductance.

In this case, the resistive elements 700 are located outside of the "shadow" of the capacitor package 717, rather than underneath the package 717. Placing the resistive elements 700 in this location is useful when the material used to make the elements 700 is of nonuniform viscosity, or when design constraints require a thick deposition of resistive element material. Excessive height in the resistive elements is to be avoided, since the capacitor package 717 to which the elements 700 are attached would otherwise be raised significantly off of the surface of the board 710, increasing the distance between the current path through the package 717 and the plane to which the individual capacitors 711 are connected, serving to increase, rather than reduce the effective inductance of the associated capacitors 711. It should also be noted that the terminals 713 of capacitors 711 not connected to resistive elements 700, as well as the resistive elements 700 themselves, are usually connected to their associated planes 712, 733 using as many vias 727, 792 as is practical, so as to reduce loop inductive reactance.

One of ordinary skill in the art will understand that the resistive element of the present invention can be used in applications other than for circuit boards and circuit packages, and thus, the invention is not to be so limited. The illustrations of a resistive element 200, 300, 400, 500, 600, and 700, a circuit board 310, 410, 510, 610, and 710, and a circuit package 305, 405, 505, 605, and 705 are intended to provide a general understanding of the structure of the present invention, and are not intended to serve as a complete description of all the elements and features of resistive elements, circuit boards, and circuit packages which might make use of the circuitry and structures described herein.

Applications which may include the novel resistive element, circuit board, and circuit package of the present invention include electronic circuitry used in high-speed computers, device drivers, power modules, communication circuitry, modems, processor modules, embedded processors, and application-specific modules, including multilayer, multi-chip modules. Such resistive elements, circuit boards, and circuit packages may further be included as sub-components within a variety of electronic systems, such as televisions, cellular telephones, personal computers, personal radios, aircraft, and others.

Figure 8:
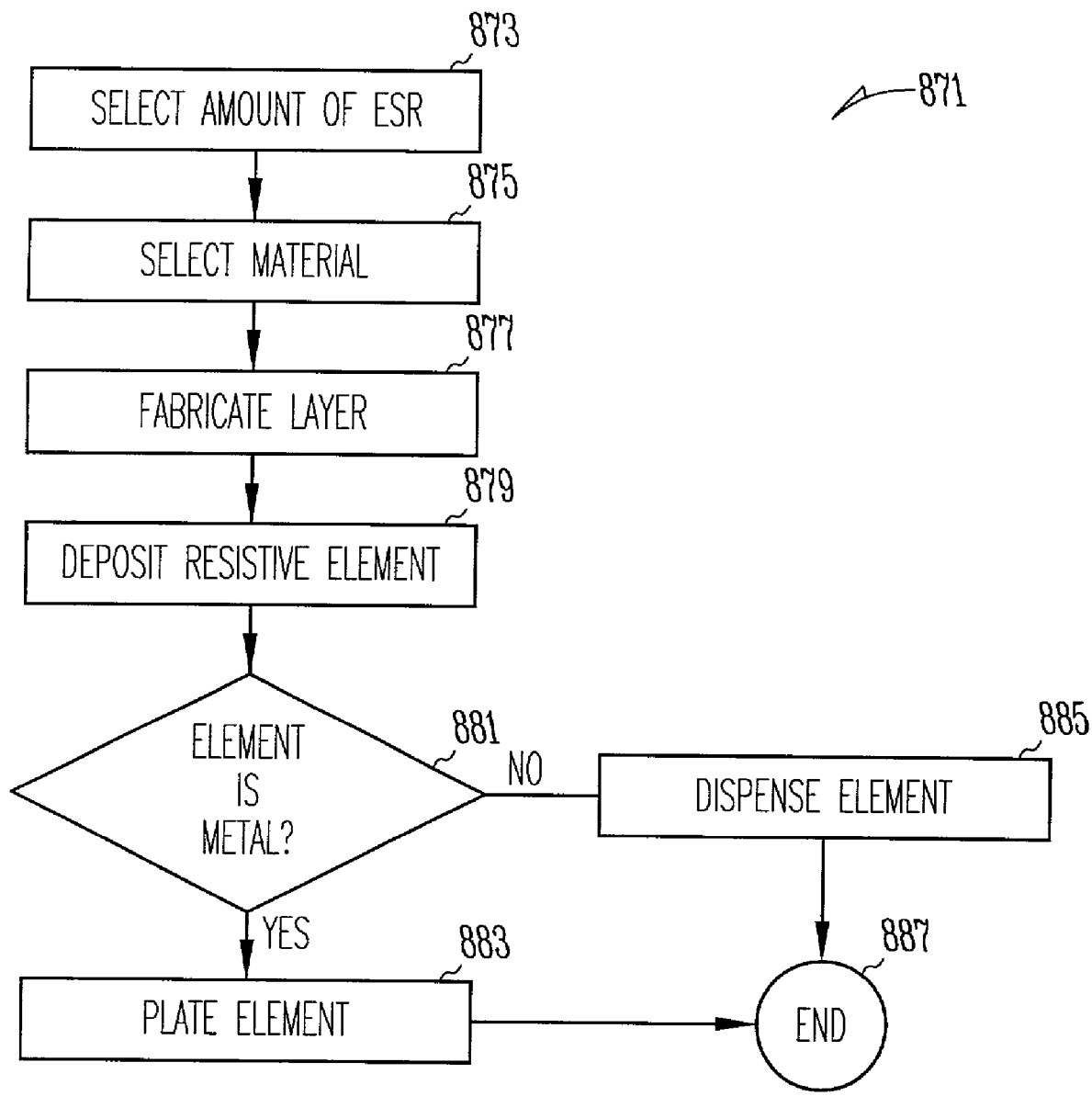
FIG. 8 is a flow chart illustrating a method of adding a resistive element to a circuit board according to the present invention.

FIG. 8 is a flow chart illustrating a method 871 of adding a resistive element to a circuit board according to the present invention. The method 871 begins at block 873 with selecting an amount of equivalent series resistance for a resistive element to be disposed on the circuit board, which will typically depend on the amount of damping required (or other desired circuit activity induced by insertion of the resistive element $R_{PL}$) in the equivalent circuit shown in FIG. 2. After the amount of resistance for $R_{PL}$ has been selected, the method 871 continues at block 875 with selecting the type of material for the resistive element. As noted above, the resistive element may include one or more resistive materials, which in turn may each include one or more metals, a conductive epoxy, a ceramic, and/or a resistive film, or a combination of these, including a conductive metal oxide, a glass, a solvent, a polymer, nickel, chromium, tantalum, silicon monoxide, cobalt, alumina, sapphire, quartz, berillium, palladium, platinum, ruthenium, rhodium, and gold, further including various thin and thick film resistor materials, such as tantalum oxynitride, tantalum nitride, nichrome, silver palladium, carbon, platinum, ruthenium, rhodium, gold, and/or tantalum-modified tin oxide.

The method 871 then continues with fabricating at least one surface layer of the circuit board, including a pad or trace and a via for connection to a conductive plane, such as a power plane (block 877) and depositing the resistive element on the surface layer of the circuit board so as to connect the pad to the via (block 879). Typically, connection is made by using a first contact point of the resistive element to make contact with the pad/trace, and using a second contact point of the resistive element to make contact with the via.

Given the wide variety of materials which may be used in the fabrication of a resistive element, the procedure used to deposit the resistive element on the surface layer of the circuit board may vary. For example, according to decision block 881, if the resistive block is not metal, then depositing the resistive element on the surface layer of the circuit board so as to connect the pad to the via may further include screening the resistive element onto the layer of the circuit board, which is a process more appropriate to the installation of thick film resistors. However, if the resistive element includes metal, such as gold over nickel, then depositing the resistive element on the layer of the circuit board so as to connect the pad to the via may include plating the resistive element onto the surface layer of the circuit board. The method ends at block 887.

The apparatus and method of the invention provides an additional series resistance which can be used in conjunction with bypass capacitors, circuit boards, and circuit packages, connected in parallel with the equivalent series resistance of the associated circuit board. The addition of series resistance, in the form of a resistive element, is accomplished in a relatively simple fashion, without unduly increasing connecting circuitry inductive reactance. The amount of series resistance is also easily selectable, in accordance with what is necessary to dampen the effects of various resonant frequencies which may be present.

Although specific embodiments have been illustrated and described herein, those of ordinary skill in the art appreciate that any arrangement which is calculated to achieve the same purpose may be substituted for the specific embodiment shown. This disclosure is intended to cover any and all adaptations or variations of the present invention. It is to be understood that the above description has been made in an illustrative fashion, and not a restrictive one. Combinations of the above embodiments, and other embodiments not specifically described herein will be apparent to those of skill in the art upon reviewing the above description. The scope of the invention includes any other applications in which the above structures, circuitry, and methods are used. The scope of the invention should be determined with reference to the appended claims, along with the full range of equivalents to which such claims are entitled.

What is claimed is:

1. A resistive element, comprising:
   a first contact point connected to a ground terminal of an integrated circuit bypass capacitor;
   a second contact point connected to a circuit board ground plane; and
   a resistive material connected to the first and second contact points, wherein a summed series resistance obtained by adding a value of resistance of the resistive element, a value of an effective series resistance of the bypass capacitor including the bypass capacitor terminal, a value of an equivalent circuit resistance between a power supply voltage terminal of the bypass capacitor and a power supply voltage terminal of a power supply decoupling capacitor located nearest to the bypass capacitor, and a value of an effective resistance between the second contact point and a ground terminal of the power supply decoupling capacitor is approximately equal to an effective series resistance of the power supply decoupling capacitor.

2. The resistive element of claim 1, wherein the first contact point is connected to the capacitor terminal using solder, and wherein the second contact point is connected to the circuit board plane using at least one via.

3. The resistive element of claim 1, wherein the resistive material includes a first metal.

4. The resistive element of claim 1, wherein the resistive material includes a conductive epoxy.

5. The resistive element of claim 1, wherein the resistive material includes a resistive component selected from a group consisting of: a metal, a conductive metal oxide, a glass, a solvent, a polymer, nickel, chromium, tantalum, oxynitride, silicon monoxide, cobalt, alumina, sapphire, quartz, berillium, palladium, carbon, platinum, ruthenium, rhodium, and gold.

6. The resistive element of claim 1, wherein the second contact point is connected to the circuit board plane using a plurality of vias.

7. The resistive element of claim 3, wherein the first metal is nickel.

8. The resistive element of claim 3, wherein the resistive material includes a second metal.

9. The resistive element of claim 8, wherein the second metal is gold.

10. The resistive element of claim 9, wherein the first and second metals have a width of about 10 to about 1000 microns, a length of about 10 to about 5000 microns, and a total thickness of about 0.05 to about 2.5 microns.

11. An apparatus, including:
a circuit element including an integrated circuit bypass capacitor; and
a resistive element including a first contact point connected to a ground terminal of the bypass capacitor, a second contact point connected to a circuit board ground plane, and a resistive material connected to the first and second contact points, wherein a summed series resistance obtained by adding a value of resistance of the resistive element, a value of an effective series resistance of the bypass capacitor including the bypass capacitor terminal, a value of an equivalent circuit resistance between a power supply voltage terminal of the bypass capacitor and a power supply voltage terminal of a power supply decoupling capacitor located nearest to the bypass capacitor, and a value of an effective resistance between the second contact point and a ground terminal of the power supply decoupling capacitor is approximately equal to an effective series resistance of the power supply decoupling capacitor.

12. The apparatus of claim 11, wherein the resistive material includes a conductive epoxy and a resistive component selected from a group consisting of: a metal, a conductive metal oxide, a glass, a solvent, a polymer, nickel, chromium, tantalum, oxynitride, silicon monoxide, cobalt, alumina, sapphire, quartz, berillium, palladium, carbon, platinum, ruthenium, rhodium, and gold.

13. The apparatus of claim 11, wherein the circuit element includes at least one transistor.

14. The apparatus of claim 11, further including: an outside surface to which the resistive element is attached.

15. The apparatus of claim 11, wherein the resistive material includes a first metal.

16. The apparatus of claim 15, wherein the first metal is nickel.

17. The apparatus of claim 15, wherein the resistive material includes a second metal.

18. The apparatus of claim 17, wherein the second metal is gold.

* * * * *